United States Patent [19]
Inoue et al.

[11] Patent Number: 5,723,362
[45] Date of Patent: Mar. 3, 1998

[54] METHOD OF FORMING INTERCONNECTION

[75] Inventors: Hajime Inoue, Kanagawa; Ryuichi Kanamura, Tokyo, both of Japan

[73] Assignee: Sony Corporation, Japan

[21] Appl. No.: 680,541

[22] Filed: Jul. 9, 1996

[30] Foreign Application Priority Data

Jul. 21, 1995 [JP] Japan .................. 7-185328

[51] Int. Cl.⁶ .................................. H01L 21/443
[52] U.S. Cl. .................. 437/190; 437/192; 437/246; 427/255.2; 204/192.15
[58] Field of Search .................... 437/190, 192, 437/194, 246, 247; 427/255.2; 204/192.15

[56] References Cited

U.S. PATENT DOCUMENTS 4,783,248  11/1988  Kohlhase et al. .............. 204/192.17
5,401,675  3/1995  Lee et al. ........................ 437/192
5,529,670  6/1996  Ryan et al. ................... 204/192.15

*Primary Examiner*—John Niebling
*Assistant Examiner*—C. Everhart
*Attorney, Agent, or Firm*—Ronald P. Kananen

[57] ABSTRACT

A method of forming an interconnection in a contact hole having a high aspect ratio, which is capable of certainly forming a barrier layer metal layer and burying a blanket W film in the contact hole without generation of any void. A Ti film is deposited in a contact hole by sputtering using a sputter system having a collimator plate and an oxidation preventive TiN thin film is deposited thereon by reactive sputtering using the same sputter system having the collimator plate. Next, a titanium silicide layer is formed by a first heat-treatment and a TiN film is formed by a second heat-treatment. Finally, a blanket W film is deposited by CVD to be buried in the contact hole.

8 Claims, 3 Drawing Sheets

METHOD OF FORMING INTERCONNECTION

BACKGROUND OF THE INVENTION

The present invention relates to a method of forming an interconnection for a semiconductor device, and particularly to a method of forming an interconnection wherein a blanket tungsten film is buried in a contact hole having a side wall on which a barrier metal layer is formed.

A processing dimension rule in a process of manufacturing semiconductor devices becomes severe with the increased integration of semiconductor devices. Thus, and in recent years, various process techniques for semiconductor devices in accordance with a half-micron rule or less were extensively developed. One of these process techniques thus developed is to form an electrode in a connection portion between each element and the corresponding interconnection or between interconnections, that is, a contact hole portion.

Since the time of manufacture of semiconductor devices in accordance with a half-micron rule or less, the formation of an electrode in a contact hole portion is shifting from the interconnecting technique using a step coverage to the interconnecting technique of burying the contact hole portion.

The contact hole burying methods include a high temperature Al alloy sputtering method in which sputtering is performed in a state that a substrate is heated at a high temperature; a tungsten selective growth method; and a metal plug forming method in which metal film (blanket tungsten film) formation by CVD or the like is combined with the subsequent etching-back.

In the above metal plug forming method, if the metal is directly buried in a contact hole, it reacts with or is diffused into an underlying semiconductor substrate in the subsequent heat-treatment step. This causes a fear of degradation or breakage of characteristics of the semiconductor element. To cope with such an inconvenience, in general, a barrier metal layer serving as both an adhesive layer for ensuring adhesion with the underlying Si substrate and a metal diffusion preventive layer is formed before the metal is buried in the contact hole. The barrier metal layer is generally formed of lamination of a Ti film and a TiN (titanium nitride) film.

The metal plug forming method in which a metal plug is formed by deposition of a metal film (a blanket W film) by CVD combined with the subsequent etching-back, which is one example of the methods of burying a contact hole as described above, will be described with reference to a schematic view in FIG. 2.

An impurity diffusion layer 12 is previously formed in a surface portion of a semiconductor substrate 11. An insulating film 13 having a thickness of about 800 nm is formed on the semiconductor substrate 11 and an opening 14 of a contact hole portion 1 for formation of an interconnection is formed in the insulating film 13. Next, a Ti film excellent in adhesion with the semiconductor substrate 11 is deposited to a thickness of about 30 nm by sputtering. Subsequently, a TiN film 16 as a barrier metal layer is deposited to a thickness of about 70 nm by sputtering. A blanket W (tungsten) film 17 is then deposited by CVD to such a thickness from the insulating film 13 as to bury the contact hole, that is, a thickness equivalent to a half or more of the opening width of the contact hole.

After that, while not shown, the blanket W film 17 is patterned to form an interconnection; or the Ti (titanium) film, TiN film and W film on the surface of the insulating film 13 are removed by etching-back or chemical/mechanical polishing for planarization, followed by deposition of an Al alloy such as AlSiCu on the surface, and the Al alloy is patterned to form an interconnection.

The above-described contact hole burying method, however, is inconvenient for a small contact hole having an aspect ratio of, for example, 2.5 or more in a process of manufacturing a semiconductor device in accordance with a half-micron rule or less. Specifically, as shown in FIG. 3, the TiN film 16 which is not deposited on the bottom of the contact hole as thickly as at the top does not function as a barrier layer for the blanket W film, to thereby degrade characteristics of the semiconductor element and to generate a shortage in burying of W in the contact hole portion, that is, a void 18 of the W film, resulting in the reduced reliability of the semiconductor device such as an increase in contact resistance and degradation in migration characteristic.

This is due to the fact that sputter particles of Ti and TiN fly not in parallel to the wall of the contact hole but in all the directions, and consequently they are deposited in a larger amount on the upper portion of the contact hole, that is, they are deposited in an over-hung shape. The formation of such an over-hung phenomenon generates a so-called shadowing effect, with a result of which sputter particles reaching the bottom of the contact hole are further reduced. In the subsequent sputtering of the TiN film 16, particularly, it becomes difficult to ensure the thickness of the TiN film on the bottom of the contact hole and thereby to form a sufficient barrier layer.

Moreover, as the Ti film 15 and TiN film 16 are deposited in the contact hole in the over-hung shape as described above, the blanket W film 17 by CVD is deposited in a shape following the over-hung shape and also the supply of the reactive gas is gradually decreased near the bottom of the contact hole, so that a large void 18 is formed on the bottom portion of the contact hole in a state in which the bracket W film is bonded to the upper portion of the contact hole as shown in FIG. 3.

A method of reducing the degree of the over-hung deposition of the Ti film 15 and TiN film 16 is disclosed, wherein a collimator plate for arranging the directivities of sputter particles is provided in a sputter system. The use of the collimator plate is not inconvenient for sputtering of a metal material excellent in adhesion such as Ti; however, it is inconvenient for sputtering of a metal material poor in adhesion such as TiN because a TiN film weakly adhering on the collimator plate is separated therefrom and the separated powder of the TiN film often acts as dust on the semiconductor substrate 1.

The above method of using the collimator plate for reducing the degree of the over-hung deposition of the Ti film and TiN film is also insufficient to solve the above disadvantages in the case of a process of manufacturing semiconductor devices in accordance with about a quarter-micron rule.

SUMMARY OF THE INVENTION

An object of the present invention is to provide a method of burying a blanket W film in a contact hole having a high aspect ratio, which is capable of solving the problems of the shortage in thickness of a TiN film on the bottom of a contact hole and of the formation of voids in a blanket W film buried in the contact hole, such problems being due to the shadowing effect upon formation of a barrier metal layer by sputtering.

To achieve the above object, according to a first aspect of the present invention, there is provided a method of forming an interconnection to an impurity diffusion layer previously formed in a specified region of a semiconductor substrate of a semiconductor device, including the steps of: forming an opening in an insulating film formed on the semiconductor substrate at a position corresponding to the impurity diffusion layer; forming a barrier metal layer composed of a Ti film and a TiN film in the opening; and burying blanket tungsten in the opening, the improvement including the steps of: depositing a Ti film in the opening by sputtering using a sputter system having a collimator plate; depositing a TiN thin film for preventing oxidation of the Ti film by reactive sputtering using a sputter system having no collimator plate; forming a titanium silicide layer on a connection portion between the Ti film and the impurity diffusion layer formed in the semiconductor substrate by a first heat-treatment; converting a surface portion of the Ti film into a TiN film by a second heat-treatment performed in a reactive gas; and depositing a blanket W film by CVD to be buried in the opening.

According to a second aspect of the present invention, there is provided a method of forming an interconnection to an impurity diffusion layer previously formed in a specified region of a semiconductor substrate of a semiconductor device, including the steps of: forming an opening in an insulating film formed on the semiconductor substrate at a position corresponding to the impurity diffusion layer; forming a barrier metal layer composed of a Ti film and a TiN film in the opening; and burying blanket tungsten in the opening, the improvement including the steps of: depositing a Ti film in the opening by sputtering using a sputter system having a collimator plate; depositing a TiN thin film for preventing oxidation of the Ti film by reactive sputtering using a sputter system having a collimator plate; forming a titanium silicide layer on a connection portion between the Ti film and the impurity diffusion layer formed in the semiconductor substrate by a first heat-treatment; converting a surface portion of the Ti film into a TiN film by a second heat-treatment performed in a reactive gas; and depositing a blanket W film by CVD to be buried in the opening.

The Ti film and the oxidation preventive TiN thin film may be continuously deposited by one sputter system having a collimator plate for each semiconductor substrate.

Preferably, the first heat-treatment is performed in an Ar gas atmosphere and the second heat-treatment is performed in a nitrogen-rich gas atmosphere.

BRIEF DESCRIPTION OF THE DRAWINGS

FIGS. 1A to 1D are schematic sectional views sequentially illustrating steps of forming an interconnection according to one example of the present invention; wherein FIG. 1A shows a state in which an oxidation preventive TiN thin film is deposited in a contact hole portion; FIG. 1B show a state in which a titanium silicide layer is formed on the surface of an impurity diffusion layer provided in a semiconductor substrate by a first heat-treatment; FIG. 1C shows a state in which a TiN film is formed on the surface of a Ti film by a second heat-treatment; and FIG. 1D shows a state in which a blanket W film is deposited in the contact hole portion by CVD;

DETAILED DESCRIPTION OF THE PREFERRED EMBODIMENT

Figure 1A:
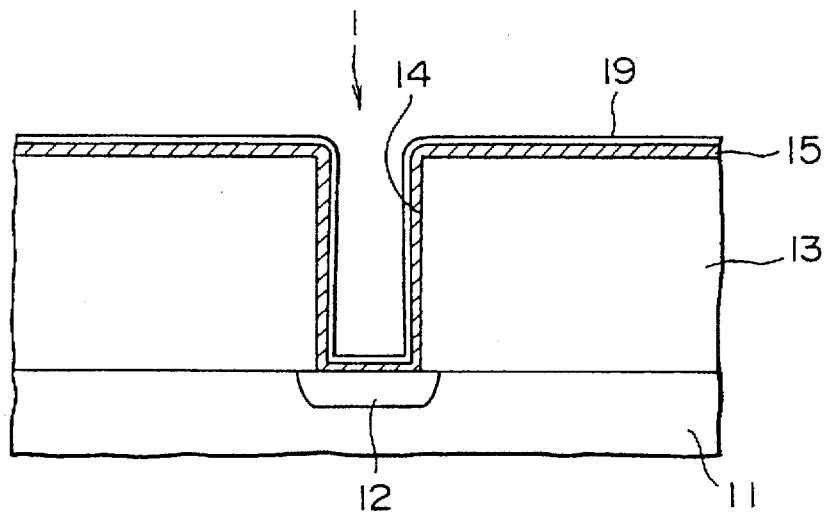

The present invention provides a method of forming an interconnection for a semiconductor device, wherein an interconnection to an impurity diffusion layer provided in a semiconductor substrate is formed by deposition of a barrier metal layer on the wall of a contact hole and burying of a blanket W film in the contact hole. More specifically, the method includes the steps of forming a Ti film and an oxidation preventive TiN thin film, forming a silicide for improving the contact with the semiconductor substrate by a first stage heat-treatment, and forming a TiN film as a barrier layer for the blanket W film by a second stage heat treatment, whereby the shadowing effect upon formation of the barrier metal layer is reduced.

A barrier metal layer, which is deposited by sputtering in a contact hole having a high aspect ratio in a process of manufacturing a semiconductor device in accordance with a sub-micron rule, is extremely thinned on the bottom of the contact hole by the shadowing effect, to cause disadvantages in losing the barrier effect and in generating voids upon formation of a blanket W film by CVD in the subsequent step.

To cope with such an inconvenience, according to the present invention, after deposition of a Ti film by sputtering using a sputter system having a collimator plate, a TiN thin film for preventing oxidation of the Ti film is deposited by reactive sputtering. Next, a silicide for improving the contact with a semiconductor substrate is formed by a first heat-treatment and a TiN film as a barrier layer for a blanket W film is formed by a second heat-treatment. The TiN film as a barrier layer is formed on the surface of the Ti film to an even thickness because it is formed by heat-treatment. This makes it possible not only to ensure the thickness of the barrier layer for the blanket W film but also to reduce the over-hung shape of the barrier metal layer on the side wall of the contact hole and prevent generation of voids of the W film in the contact hole portion.

In general, when a TiN film is deposited using a sputter system having a collimator plate, the TiN film adhering on the collimator plate is separated therefrom and the separated powder becomes dust. However, an oxidation preventive TiN thin film deposited by reactive sputtering is reduced in generation of dust, and accordingly, a sputter system having a collimator plate can be also used for reactive sputtering for deposition of an oxidation preventive TiN thin film, with a result that the over-hung shape of the barrier metal layer on the side wall of the contact hole can be reduced and thereby generation of voids of the W film in the contact hole portion can be reduced.

The sputtering for a Ti film and reactive sputtering for an oxidation preventive TiN film may be continuously performed using one sputter system having a collimator plate for each semiconductor substrate. At this time, adhesive Ti films and thin TiN films are deposited on the collimate plate in a sandwich-like structure, to thereby significantly reduce generation of duct due to separation of these deposited films.

The method of burying a blanket W film in a contact hole having a high aspect ratio according to the present invention will be more fully described by way of example with reference to schematic views of FIGS. 1A to 1D.

Figure 2:
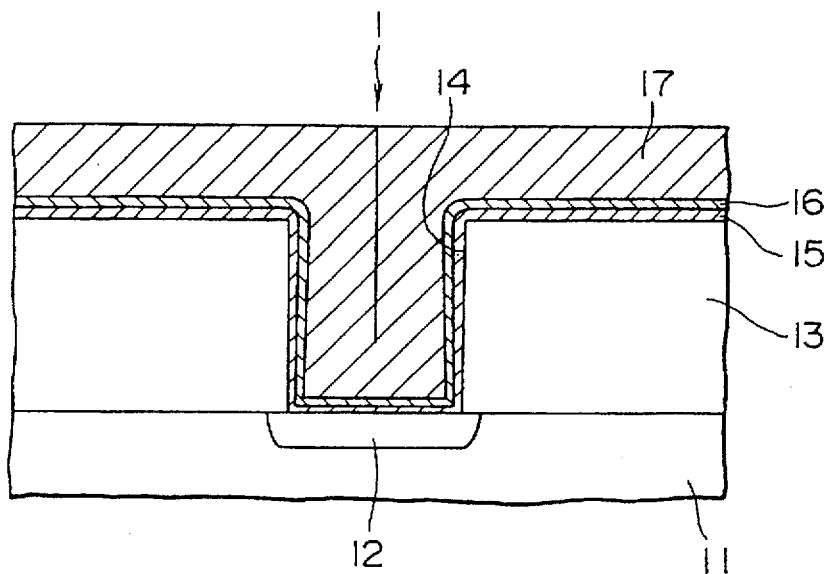
FIG. 2 is a schematic sectional view of a contact hole portion buried with a blanket W film deposited by CVD according to a related art contact hole burying method.
Figure 3:
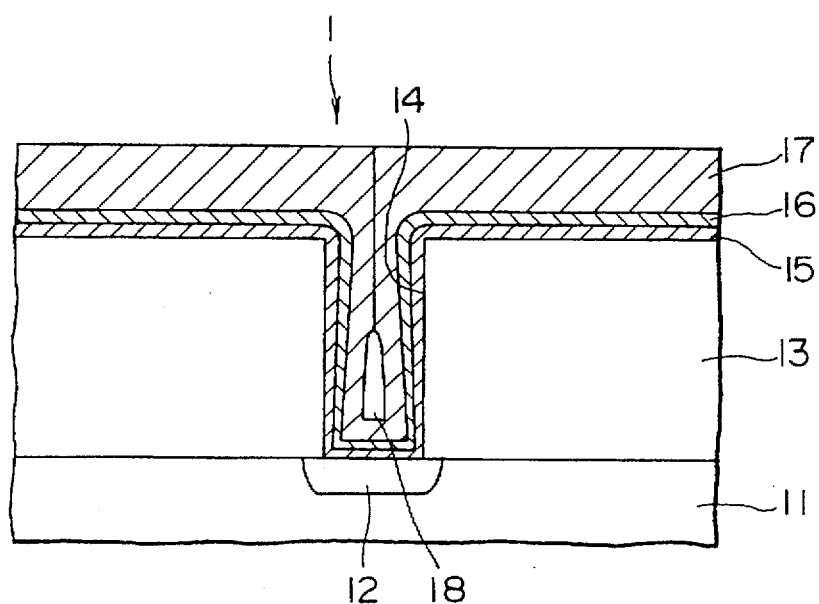
FIG. 3 is a schematic sectional view of a contact hole portion buried with a blanket W film deposited by CVD according to the related art contact hole burying method, wherein a void is formed in the W film buried in the contact hole portion.

It is to be noted that parts corresponding to those described in the related art with reference to FIGS. 2, 3 are indicated by the same characters.

As shown in FIG. 1A, an impurity diffusion layer 12 is previously formed in a semiconductor substrate 11, and an insulating film 13 made of, for example, SiO$_2$ is formed on the semiconductor substrate 11 to a thickness of about 800 nm. Then, an opening 14 of a contact hole portion 1 for forming an interconnection is formed in the insulating film 13. Next, a Ti film 15 excellent in adhesion with the semiconductor substrate 11 is deposited to a thickness of about 30 nm by sputtering in one sputter chamber of a sputter system inserted with a collimator plate having an aspect ratio of 1.5. The deposition condition for the Ti film 15 by sputtering is, for example, set as follows:

| Deposition Condition for Ti Film 15 | |
| --- | --- |
| flow rate of Ar | 100 sccm |
| gas pressure | 267 Pa |
| substrate temperature | 150 °C. |
| sputtering power | 8 kW |

Next, following on the above deposition of the Ti film 15, a TiN film 19 for preventing oxidation of the Ti film 15 is deposited to a thickness of about 10 nm by reactive sputtering in another sputter chamber having no collimator plate in the same sputter system as that used for deposition of the Ti film 15. The deposition condition for the TiN film 19 is, for example, set as follows:

| Deposition Condition for TiN film 19 | |
| --- | --- |
| sputter target | Ti |
| flow rate of N$_2$ | 135 sccm |
| flow rate of Ar | 15 sccm |
| gas pressure | 600 Pa |
| substrate temperature | 150 °C. |
| sputtering power | 6.5 kw |

Figure 1B:
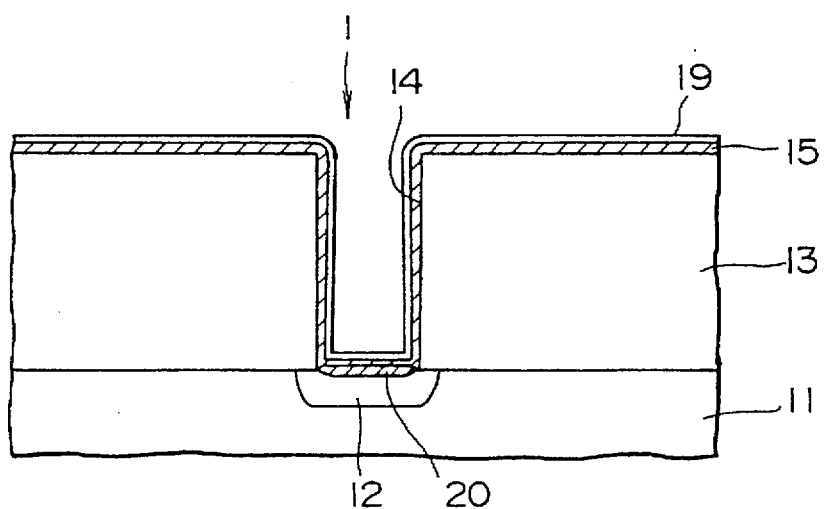
Figure 1C:
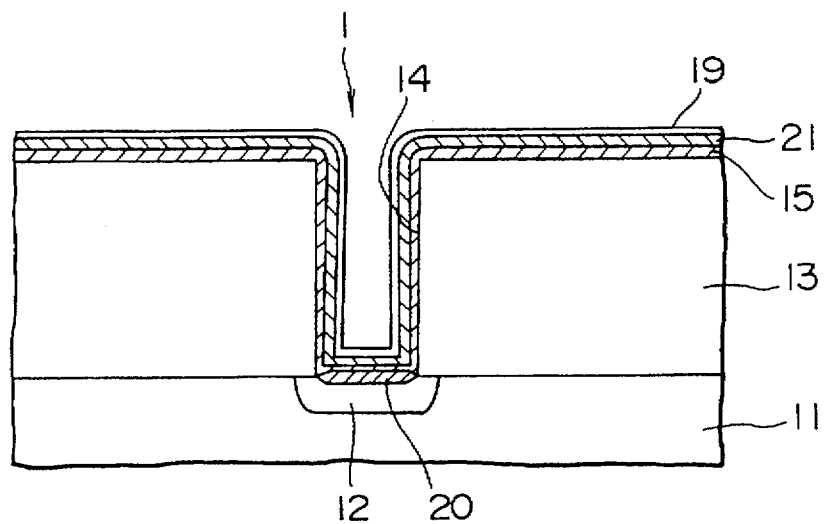

After the above sputtering step, the semiconductor substrate 11 is taken out of the sputter system, and is subjected to two stage heat-treatments in an infrared heating device as shown in FIGS. 1B and 1C. The first stage heat-treatment is performed for allowing part of the TiN film 15 being in contact with the surface of the impurity diffusion region 12 of the semiconductor substrate 11 to thermally react with the impurity diffusion region 12 so as to form a titanium silicide layer 20.

The second stage heat-treatment using an NH$_3$ gas or the like is performed for nitriding the surface of the Ti film 15 under the oxidation preventive TiN thin film 19, to form a TiN film 21. The two stage heat-treatment conditions are, for example, set as follows:

| First Stage Heat-treatment: | |
| --- | --- |
| flow rate of Ar: | 1000 sccm |
| silicon substrate temperature: | 650 °C. |
| heat-treatment time: | 30 sec |
| Second Stage Heat-treatment: | |
| flow rate of NH$_3$: | 1000 sccm |
| silicon substrate temperature: | 650 °C. |
| heat treatment time: | 30 sec |

It is to be noted that when the Ti film 15 on the impurity diffusion layer 12 in the contact hole portion 1 is thick, N$_2$ gas may be used for the first stage heat-treatment in place of Ar gas.

Figure 1D:
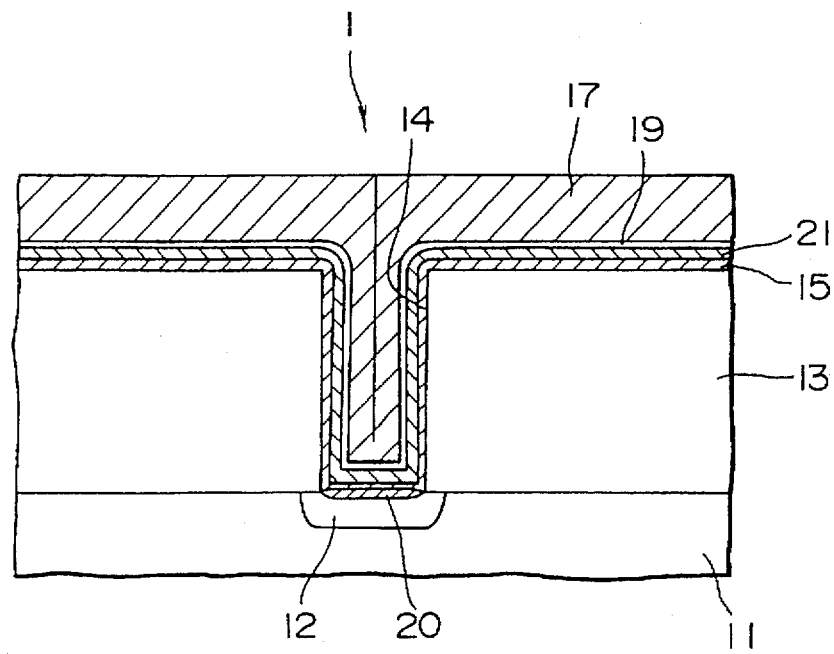

Next, as shown in FIG. 1D, a blanket W film 17 is deposited by low pressure CVD so as to be buried in the contact hole. The deposition condition for the blanket W film 17 is, for example, set as follows. In addition, the thickness of the blanket W film 17 from the insulating film 13 is set at a value larger than a half of the opening diameter of the opening 17, for example, about 400 nm.

| Deposition Condition for Blanket W Film | |
| --- | --- |
| flow rate of WF$_6$ | 60 sccm |
| flow rate of H$_2$ | 350 sccm |
| pressure | 1.07E4 Pa |
| temperature | 475 °C. |

After that, while not shown, the blanket W film 17 is patterned to form an interconnection, or the Ti film, TiN film and blanket W film on the insulating film 13 are removed by etching-back or chemical/mechanical polishing for planarization and an Al alloy such as AlSiCu is deposited on the surface and is patterned to form an interconnection.

In the above example of the present invention, the deposition of the oxidation preventive TiN thin film 19 is performed in the sputter chamber having no collimator plate; however, it may be performed in the same sputter chamber having the collimator plate as that used for deposition of the Ti film 15. In this case, however, it is required to give particular attention to adhering of dust due to separation of the TiN film from the collimator plate on the semiconductor substrate 11.

In the case where the Ti film 15 and the TiN thin film 19 are continuously deposited in the same chamber having a collimator plate for each semiconductor substrate 11, a TiN film portion adhering on the collimator plate upon reactive sputtering for deposition of the oxidation preventive TiN film is overlapped in a sandwich structure by an adhesive Ti film portion upon sputtering for deposition of the Ti film for the next semiconductor substrate, and thereby it is difficult to be separated from the collimator plate, thereby significantly reducing generation of dust. Such an effect of significantly reducing generation of dust is due to the fact that since the reactive sputtering is performed for deposition of an extremely thin oxidation preventive TiN film, the TiN film portion adheres on the collimator plate only in a slight amount.

While the present invention has been described by way of the example, such description is for illustrative purposes only, and it is to be understood that many changes and variations may be made without departing from the spirit or scope of the following claims. For example, the thickness of each of the Ti film 15 and the oxidation preventive TiN thin film 19, the deposition conditions thereof, and the conditions of the two stage heat-treatments may be variously changed.

What is claimed is:

1. A method of forming an interconnection to an impurity diffusion layer previously formed in a specified region of a semiconductor substrate of a semiconductor device, said method comprising the steps of:

forming an opening in an insulating film formed on said semiconductor substrate at a position corresponding to said impurity diffusion layer;

forming a barrier metal layer composed of a Ti film and a TiN film in said opening; and burying blanket tungsten in said opening, the improvement comprising the steps of:

depositing said Ti film in said opening by sputtering using a sputter system having a collimator plate;

depositing said TiN thin film for preventing oxidation of said Ti film by reactive sputtering using a sputter system having no collimator plate;

forming a titanium silicide layer on a connection portion between said Ti film and said impurity diffusion layer formed in said semiconductor substrate by a first heat-treatment;

converting a surface portion of said Ti film into a TiN film by a second heat-treatment performed in a reactive gas; and depositing a blanket W film by CVD to be buried in said opening.

2. A method of forming an interconnection according to claim 1, wherein said first heat-treatment is performed in an Ar gas atmosphere and said second heat-treatment is performed in a nitrogen-rich gas atmosphere.

3. A method of forming an interconnection according to claim 1, wherein said opening comprises a contact hole portion for forming an interconnection to the impurity diffusion layer and is formed in the insulating film.

4. A method for forming an interconnection according to claim 1, wherein said Ti film is deposited to a thickness of about 30 nm by sputtering in one sputter chamber of a sputter system inserted with a collimator plate having an aspect ratio of about 1.5.

5. A method for forming an interconnection according to claim 4 wherein the TiN film is deposited to a thickness of about 10 nm by reactive sputtering in another sputter chamber having no collimator plate.

6. A method of forming an interconnection to an impurity diffusion layer previously formed in a specified region of a semiconductor substrate of a semiconductor device, said method comprising the steps of:

forming an contact hole opening having a high aspect ratio in an insulating film formed on said semiconductor substrate at a position corresponding to said impurity diffusion layer;

forming a barrier metal layer composed of a Ti film and a TiN film in said contact hole opening which barrier metal layer tends to be thinned on the bottom of said contact hole opening by a shadowing effect, thus causing a disadvantage in lowering a barrier effect from said barrier metal layer and generating voids upon formation of a W film by CVD in a subsequent step; and burying blanket tungsten in said opening, which generates voids in a W film by CVD when said barrier metal layer is thinned at the bottom of the contact hole opening, the improvement comprising the steps of:

depositing said Ti film in said opening by sputtering using a sputter system having a collimator plate;

depositing said TiN thin film for preventing oxidation of said Ti film by reactive sputtering using a sputter system, wherein said sputter system for depositing said TiN thin film has no collimator plate;

forming a titanium silicide layer on a connection portion between said Ti film and said impurity diffusion layer formed in said semiconductor substrate by a first heat-treatment;

converting a surface portion of said Ti film into a TiN film to a substantially even thickness by a second heat-treatment performed in a reactive gas; and depositing a blanket W film by CVD to be buried in said opening, whereby the evenness of the thickness of the barrier layer is substantially the same in said contact hole opening to reduce an over-hung shape of the barrier metal layer, thus to prevent generation of voids in the W film in the contact hole portion.

7. A method of forming an interconnection according to claim 6, wherein said first heat-treatment is performed in an Ar gas atmosphere and said second heat-treatment is performed in a nitrogen-rich gas atmosphere.

8. A method of forming an interconnection according to claim 6, wherein said first heat-treatment is performed in an Ar gas atmosphere and said second heat-treatment is performed in a nitrogen-rich gas atmosphere.

* * * * *